United States Patent
Song et al.

(10) Patent No.: US 8,906,735 B2
(45) Date of Patent: Dec. 9, 2014

(54) DONOR SUBSTRATES, METHODS OF MANUFACTURING DONOR SUBSTRATES, ORGANIC LIGHT EMITTING DISPLAY DEVICES AND METHODS OF MANUFACTURING ORGANIC LIGHT EMITTING DISPLAY DEVICES

(75) Inventors: Ha-Jin Song, Yongin-si (KR);
Sang-Woo Pyo, Yongin-si (KR);
Byeong-Wook Yoo, Yongin-si (KR);
Hyo-Yeon Kim, Yongin-si (KR);
Ji-Young Kwon, Yongin-si (KR);
Kwan-Hee Lee, Yongin-si (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/554,882

(22) Filed: Jul. 20, 2012

(65) Prior Publication Data
US 2013/0048959 A1    Feb. 28, 2013

(30) Foreign Application Priority Data
Aug. 26, 2011   (KR) .................. 10-2011-0085652

(51) Int. Cl.
H01L 51/40   (2006.01)
H01L 51/00   (2006.01)
H01L 51/50   (2006.01)

(52) U.S. Cl.
CPC ............. *H01L 51/0013* (2013.01); *H01L 51/50* (2013.01)

USPC   438/99; 257/40; 257/E51.013; 257/E51.017; 427/457; 313/504

(58) Field of Classification Search
USPC ................ 257/40; 427/457; 313/504; 438/99
See application file for complete search history.

(56) References Cited

U.S. PATENT DOCUMENTS

| 5,543,017 | A | * | 8/1996 | Uchiyama et al. ............ 204/169 |
| 6,140,009 | A | * | 10/2000 | Wolk et al. .................... 430/200 |
| 7,361,416 | B2 | | 4/2008 | Kim et al. |
| 7,381,471 | B2 | * | 6/2008 | Augustine et al. ............ 428/447 |
| 2004/0160167 | A1 | * | 8/2004 | Arai et al. ..................... 313/500 |
| 2007/0190356 | A1 | * | 8/2007 | Arakane et al. ............... 428/690 |
| 2007/0254204 | A1 | * | 11/2007 | Shin et al. ........................ 429/38 |
| 2008/0097072 | A1 | * | 4/2008 | Takebe et al. ................. 528/271 |
| 2010/0261031 | A1 | * | 10/2010 | Chung et al. .................. 428/601 |

FOREIGN PATENT DOCUMENTS

| KR | 1020050023001 A | 3/2005 |
| KR | 1020080065839 A | 7/2008 |
| KR | 1020110040244 A | 4/2011 |

* cited by examiner

*Primary Examiner* — Matthew W Such
*Assistant Examiner* — Samuel Lair
(74) *Attorney, Agent, or Firm* — Knobbe Martens Olson & Bear LLP (57) ABSTRACT

A donor substrate includes a base layer, a light to heat conversion layer on the base layer, an interlayer on the light to heat conversion layer, a low molecular weight transfer layer on the interlayer and an organic transfer layer on the low molecular weight transfer layer. The low molecular weight transfer layer includes an element in Group I or a compound of elements in Group I and Group VII.

7 Claims, 8 Drawing Sheets

DONOR SUBSTRATES, METHODS OF MANUFACTURING DONOR SUBSTRATES, ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATIONS

This application claims priority under 35 USC §119 to Korean Patent Application No. 10-2011-0085652 filed on Aug. 26, 2011 in the Korean Intellectual Property Office (KIPO), the contents of which are herein incorporated by reference in their entirety.

BACKGROUND

1. Field

Example embodiments relate to donor substrates, methods of manufacturing the donor substrates, organic light emitting display devices and methods of manufacturing the organic light emitting display devices. Example embodiments relate to donor substrates for transferring organic layers of organic light emitting display devices, methods of manufacturing the donor substrates, the organic light emitting display devices manufactured using the donor substrates and methods of manufacturing the organic light emitting display devices using the donor substrates.

2. Description of the Related Technology

An organic light emitting display (OLED) device may display desired information such as images, letters and/or characters using a light generated by the combination of holes provided from an anode and electrons provided from a cathode in an organic layer thereof.

To form the organic layer of the OLED device, a printing process using an inkjet, a spin or a nozzle, a patterning process after depositing layers, and a transfer process using a heat or a laser have been utilized. For example, a laser induced thermal imaging (LITI) process has been widely used for forming the organic layer because the organic layer may be finely patterned by relatively simple steps or processes.

As for the LITI process, a light generated from a light source may be absorbed by a light to heat conversion layer of a donor substrate so that a light energy may be converted into a thermal energy or a heat. A transfer layer may be transferred onto a predetermined device substrate by the thermal energy or the heat.

However, the transfer layer may be damaged by the thermal energy or the heat. Further, the transfer layer may not be easily detached or separated from the donor substrate, so that the transfer layer may not be precisely transferred onto a predetermined region of the device substrate.

SUMMARY OF CERTAIN INVENTIVE ASPECTS

Example embodiments provide a donor substrate for effectively transferring organic layers while improving electrical and physical characteristics.

Example embodiments provide a method of manufacturing a donor substrate for effectively transferring organic layers ensuring improved electrical and physical characteristics.

Example embodiments provide an organic light emitting display device comprising organic layers having improved electrical and physical characteristics.

Example embodiments provide a method of manufacturing an organic light emitting display device comprising organic layers having improved electrical and physical characteristics.

According to example embodiments there is provided a donor substrate. The donor substrate may include a base layer, a light to heat conversion layer on the base layer, an interlayer on the light to heat conversion layer, a low molecular weight transfer layer on the interlayer and an organic transfer layer on the low molecular weight transfer layer. The low molecular weight transfer layer may include an element in Group I or a compound of elements in Group I and Group VII.

In example embodiments, the low molecular weight transfer layer may include lithium (Li), sodium (Na), cesium (Cs), potassium (K), lithium fluoride (LiF), potassium fluoride (KF), cesium fluoride (CsF), lithium iodide (LiI) or potassium iodide (KI). These may be used alone or in a mixture thereof.

In example embodiments, the interlayer may include a treated upper surface having a hydrophilicity. The low molecular weight transfer layer may be combined with the treated upper surface of the interlayer by a dipole interaction or an electrostatic attraction.

According to example embodiments there is provided an organic light emitting display device. The organic light emitting display device may include a first electrode on a lower substrate, a hole transport layer on the first electrode, an emitting layer on the hole transport layer, a low molecular weight layer on the emitting layer, an electron transport layer on the low molecular weight layer and a second electrode on the electron transport layer. The low molecular weight layer may include an element in Group I or a compound of elements in Group I and Group VII.

In example embodiments, the low molecular weight layer may include lithium (Li), sodium (Na), cesium (Cs), potassium (K), lithium fluoride (LiF), potassium fluoride (KF), cesium fluoride (CsF), lithium iodide (LiI) or potassium iodide (KI). These may be used alone or in a mixture thereof.

In example embodiments, the low molecular weight layer may have a thickness of about 3 Å to about 100 Å.

According to example embodiments, there is provided a method of manufacturing a donor substrate. In the method, a light to heat conversion layer may be formed on a base layer. An interlayer may be formed on the light to heat conversion layer. A surface treatment comprising an ultraviolet treatment or a plasma treatment may be performed on the interlayer to form a treated upper surface of the interlayer. A low molecular weight transfer layer may be formed using a low molecular weight material on the treated upper surface of the interlayer. The low molecular weight material may include an element Group I or a compound of elements in Group I and Group VII. An organic transfer layer may be formed on the low molecular weight transfer layer.

In example embodiments, the low molecular weight transfer layer may include lithium (Li), sodium (Na), cesium (Cs), potassium (K), lithium fluoride (LiF), potassium fluoride (KF), cesium fluoride (CsF), lithium iodide (LiI) or potassium iodide (KI). These may be used alone or in a mixture thereof.

In example embodiments, the low molecular weight transfer layer may be formed by a vacuum evaporation process or a sputtering process.

In example embodiments, the treated upper surface of the interlayer may have a hydrophilicity, and the treated upper surface may have dangling bonds.

In example embodiments, the low molecular weight material may be combined with the dangling bonds by a dipole interaction or an electrostatic attraction.

In example embodiments, a heat treatment may be additionally performed on the interlayer before the ultraviolet treatment or the plasma treatment.

In example embodiments, the heat treatment may be performed at a temperature of about 60° C. to about 150° C.

According to example embodiments there is provided a method of manufacturing an organic light emitting device. In the method, a device substrate comprising a first electrode and a pixel defining layer partially exposing the first electrode may be prepared. A donor substrate comprising a base layer, a light to heat conversion layer, an interlayer, a low molecular weight transfer layer and an organic transfer layer may be formed. The low molecular weight transfer layer may include an element in Group I or a compound of elements in Group I and Group VII. The donor substrate may be arranged over the device substrate so that the organic transfer layer may face the first electrode of the device substrate. A laser beam may be irradiated on the donor substrate to transfer portions of the low molecular weight transfer layer and the organic transfer layer onto the exposed first electrode to thereby form an organic layer and a low molecular weight layer sequentially stacked on the exposed first electrode. An electron transport layer may be formed on the low molecular weight layer. A second electrode may be formed on the electron transport layer.

In example embodiments, the interlayer may include a treated upper surface having a hydrophilicity. The low molecular weight transfer layer may be combined with the treated upper surface of the interlayer by a dipole interaction or an electrostatic attraction.

In example embodiments, a hole transport layer may be further formed on the pixel defining layer and the exposed first electrode after preparing the device substrate. The organic layer may be formed on a portion of the hole transport layer and on a sidewall of the pixel defining layer. The organic layer may correspond to an emitting layer of the organic light emitting display device.

In example embodiments, the organic transfer layer may include an emitting layer formed on the low molecular weight transfer layer and a hole transport layer formed on the emitting layer.

In example embodiments, the organic layer may be formed on the exposed first electrode and on a sidewall of the pixel defining layer, and the low molecular weight layer may be formed on the organic layer and the sidewall of the pixel defining layer.

In example embodiments, the electron transport layer may be formed by a laser induced thermal imaging (LITI) process, a nozzle printing process, an inkjet printing process or an imprinting process.

In example embodiments, the organic layer, the low molecular weight layer and the electron transport layer may be confined by a recess. The recess may be defined by the exposed first electrode and a sidewall of the pixel defining layer.

According to example embodiments, a heat treatment, a plasma treatment and/or an ultraviolet treatment may be performed on an interlayer of a donor substrate so that surface properties of the interlayer may be improved. Thus, an organic transfer layer formed on the interlayer may have improved interface properties. Further, the organic transfer layer may be easily transferred onto a device substrate by a small quantity of energy. Additionally, a low molecular weight transfer layer comprising elements in Group I or compounds in Group I-VII may be formed between the interlayer and the organic transfer layer so that the organic transfer layer may be more easily detached from the interlayer or transferred onto the device substrate. Furthermore, electrical characteristics of the organic transfer layer may be enhanced.

BRIEF DESCRIPTION OF THE DRAWINGS

Example embodiments will be more clearly understood from the following detailed description taken in conjunction with the accompanying drawings. FIGS. 1 to 7 represent non-limiting, example embodiments as described herein.

DETAILED DESCRIPTION OF CERTAIN INVENTIVE EMBODIMENTS

Various example embodiments will be described more fully hereinafter with reference to the accompanying drawings, in which some example embodiments are shown. The present embodiment may, however, be embodied in many different forms and should not be construed as limited to the example embodiments set forth herein. Rather, these example embodiments are provided so that this description will be thorough and complete, and will fully convey the scope of the present embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting to the present embodiments. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present embodiments.

Unless otherwise defined, all terms (including technical and scientific terms) used herein have the same meaning as commonly understood by one of ordinary skill in the art to which the present embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
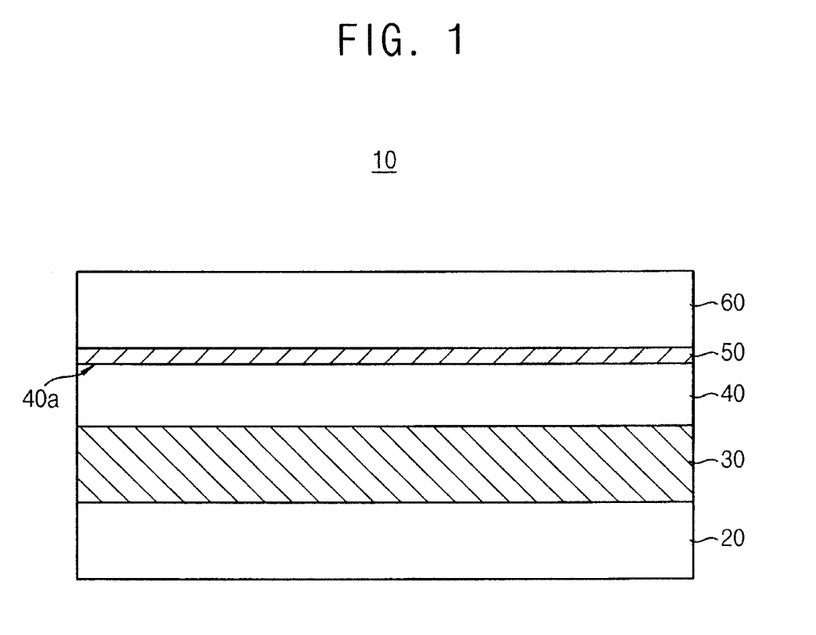
FIG. 1 is a cross-sectional view illustrating a donor substrate in accordance with example embodiments.

FIG. 1 is a cross-sectional view illustrating a donor substrate in accordance with example embodiments.

Referring to FIG. 1, a donor substrate 10 may include a base layer 20, a light to heat conversion (LTHC) layer 30, an interlayer 40, a low molecular weight transfer layer 50 (hereinafter, referred to as an LMT layer) and an organic transfer layer 60.

The base layer 20 may be sufficiently transparent for transmitting a light to the LTHC layer 30. Additionally, the base layer 20 may have predetermined mechanical strength to serve as a supporting layer. For example, the base layer 20 may include transparent polymer such as polyethylene terephthalate (PET)-based resin, polyacryl-based resin, polyepoxy-based resin, polyethylene-based resin, polystyrene-based resin, polyimide-based resin, polycarbonate-based resin, polyether-based resin, polyacrylate-based resin, etc. These may be used alone or in a combination thereof. Alternatively, the base layer 20 may include may include glass, quartz or other transparent ceramic materials.

The LTHC layer 30 may be disposed on the base layer 20. The LTHC layer 30 may absorb a light having a wavelength of infrared-ultraviolet (IR-UV) to convert the light into a thermal energy. Thus, the LTHC layer 30 may include a material having a predetermined optical density and a required light-absorbance. For example, the LTHC layer 30 may include metal such as aluminum (Al), nickel (Ni), molybdenum (Mo), titanium (Ti), zirconium (Zr), copper (Cu), vanadium (V), tantalum (Ta), palladium (Pd), ruthenium (Ru), iridium (Ir), gold (Au), silver (Ag) or platinum (Pt), oxides of these metals, sulfides of these metals, carbon black, graphite, polymers containing a light-absorbent material such as a infrared dye, etc. These may be used alone or in a combination thereof. The LTHC layer 30 may have a single-layered structure or a multi-layered structure comprising the above-mentioned materials.

The interlayer 40 may be disposed on the LTHC layer 30. The interlayer 40 may prevent the LMT layer 50 and/or the organic transfer layer 60 from being contaminated by the light-absorbent material of the LTHC layer 30. For example, the interlayer 40 may include acryl resin or alkyd resin.

In example embodiments, the interlayer 40 may have an upper surface 40a that may be treated by a surface treatment comprising a heat treatment, an UV treatment and/or a plasma treatment. The upper surface 40a may ensure an enhanced surface uniformity by the heat treatment, or may have hydrophilicity by the UV treatment or the plasma treatment.

The LMT layer 50 may be disposed on the interlayer 40. In example embodiments, the LMT layer 50 may include a low molecular weight material containing an element in Group I or a compound of elements in Group I and Group VII. For example, the LMT layer 50 may include lithium (Li), sodium (Na), cesium (Cs), potassium (K), lithium fluoride (LiF), potassium fluoride (KF), cesium fluoride (CsF), lithium iodide (LiI), potassium iodide (KI), etc. These may be used alone or in a combination thereof. In example embodiments, the LMT layer 50 may have a thickness of from about 3 Å to about 100 Å.

In example embodiments, the upper surface 40a of the interlayer 40 may have the hydrophilicity by the UV treatment and/or the plasma treatment, so that the upper surface 40a may be combined with the low molecular weight material exposed at a surface of the LMT layer 50 by weak dipole interaction and/or electrostatic attraction.

The organic transfer layer 60 may be disposed on the LMT layer 50. The organic transfer layer 60 may correspond to an emitting layer (EML) of an organic light emitting display (OLED) device. The organic transfer layer 60 may additionally include optional organic layers of the OLED device, for example, a hole injection layer (HIL), a hole transport layer (HTL), an electron injection layer (EIL), an electron transport layer (ETL), etc. The organic transfer layer 60 may have a single-layered structure comprising one of the above-described organic layers or a multi-layered structure comprising at least two of the organic layers. The organic transfer layer 60 may include suitable materials depending on the types of the organic layers included therein.

The EML may include at least one of light emitting materials for generating different colors of light, for example, a red color of light, a green color of light or a blue color of light. In some example embodiments, the EML may include a mixture of the light emitting materials for generating a white color of light. In some example embodiments, the light emitting materials may serve as dopant materials of the EML. In this case, the EML may further include host materials. Suitable dopant and host materials may be selected in accordance with a light-emitting mechanism of the EML, for example, a fluorescent mechanism or a phosphorescent mechanism.

When the EML generates a red color of light, the EML may include, for example, a low molecular weight material such as Alq3 (host)/DCJTB (fluorescence dopant), Alq3 (host)/DCM (fluorescence dopant) or CBP (host)/PtOEP (phosphorescent organic metal complex) and polymer such as a PFO (poly(9, 9-dioctylfluorene))-based polymer, a PPV Poly(p-phenylene vinylene)-based polymer, etc. In case that the EML generates a green color of light, the EML may include a low molecular weight material such as Alq3 (host)/C545t (dopant) or CBP (4,4'-bis(carbazol-9-yl)biphenyl) (host)/IrPPy (phosphorescent organic metal complex) and polymer such as PFO-based polymer, PPV-based polymer, etc. When the EML generates a blue color of light, the EML may include a low molecular weight material such as DPVBi, spiro-DPVBi, spiro-6P, DSB or DSA, and polymer such as PFO-based polymer, PPV-based polymer, etc.

The HIL may include TCTA (Tris(4-carbazoyl-9-ylphenyl)amine), m-MTDATA (4,4',4"-Tris(N-3-methylphenyl-N-phenylamino)triphenylamine), m-MTDAPB (1,3,5-tris[4-(3-methylphenylphenylamino)phenyl]benzene), 2-TNATA (4,4',4"-Tris(N-(2-naphthyl)-N-phenyl-amino)-triphenylamine), etc. The HTL may include NPB, TPD, α-NPD, N-phenylcarbazole, polyvinylcarbazole, etc. The ETL may include Alq, PBD, TAZ, rubrene, etc. The EIL may include a low molecular weight material such as Alq3, Ga complex or PBD, or polymer such as oxadiazole-based polymer.

Figure 2:
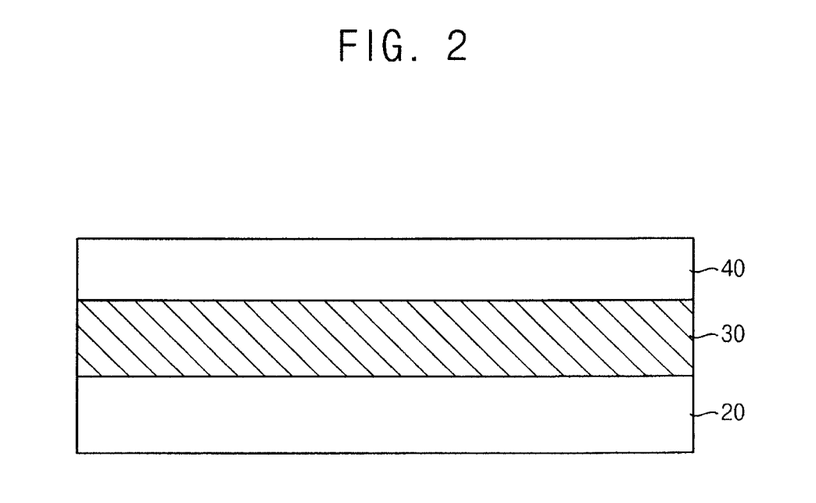
FIGS. 2 to 4 are cross-sectional views illustrating a method of manufacturing a donor substrate in accordance with example embodiments.
Figure 3:
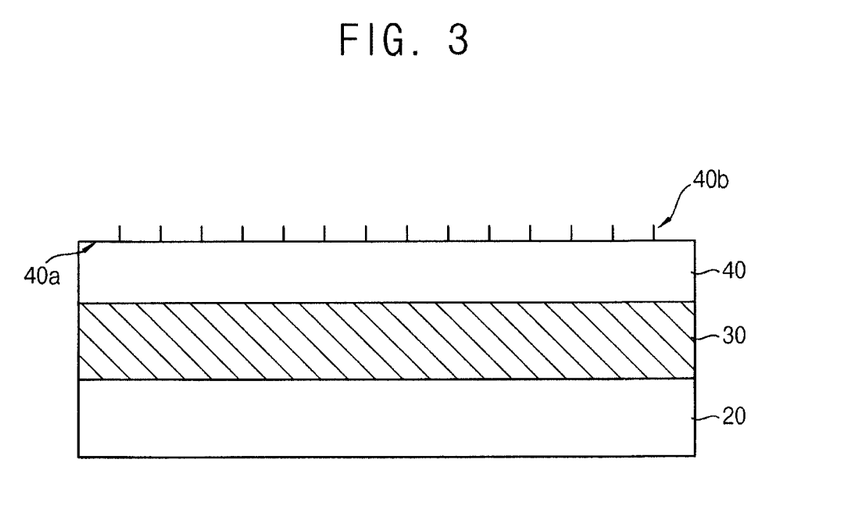
Figure 4:
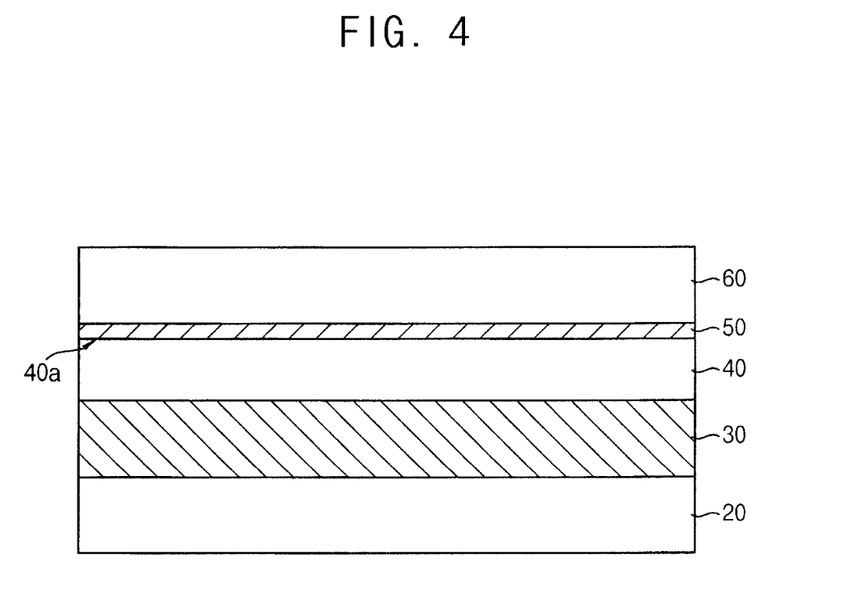

FIGS. 2 to 4 are cross-sectional views illustrating a method of manufacturing a donor substrate in accordance with example embodiments.

Referring to FIG. 2, an LTHC layer 30 and an interlayer 40 may be sequentially formed on a base layer 20.

The base layer 20 may be formed using transparent polymer such as polyethylene terephthalate (PET)-based resin, polyacryl-based resin, polyepoxy-based resin, polyethylene-based resin, polystyrene-based resin, polyimide-based resin, polycarbonate-based resin, polyether-based resin, polyacrylate-based resin, etc. These may be used alone or in a mixture thereof. Alternatively, a glass layer or a quartz layer may be employed as the base layer 20.

The LTHC layer 30 may be formed using metal, metal oxide, metal sulfide, carbon black, graphite or polymer containing a light-absorbent material such as an infrared dye. Examples of the metal may include aluminum (Al), nickel (Ni), molybdenum (Mo), titanium (Ti), zirconium (Zr), copper (Cu), vanadium (V), tantalum (Ta), palladium (Pd), ruthenium (Ru), iridium (Ir), gold (Au), silver (Ag), platinum (Pt), etc. When the LTHC layer 30 includes the metal, the metal oxide, the metal sulfide, carbon block or carbon black, the LTHC layer 30 may be obtained by a vacuum evaporation process, an electron beam evaporation process, a sputtering process, etc. When the LTHC layer 30 includes the polymer, the LTHC layer 30 may be obtained by a coating process such as a roll coating process, an extrusion coating process, a spin coating process, a knife coating process, etc. The LTHC layer 30 may have a single-layered structure or a multi-layered structure.

The interlayer 40 may be formed on the LTHC layer 30 by depositing acryl resin or alkyd resin on the LTHC layer 30. For example, the interlayer 40 may be obtained by a vacuum evaporation process, a thermal evaporation process, a slit coating process, a spin coating process, etc.

Referring to FIG. 3, an upper surface 40*a* of the interlayer 40 may be treated by a surface treatment, for example, a thermal treatment, an UV treatment and/or a plasma treatment.

Some bonds or chains forming polymer at an upper portion of the interlayer 40 may be broken or damaged by the surface treatment to thereby generate bond-loss sites. Accordingly, dangling bonds 40*b* may be exposed on the upper surface 40*a* of the interlayer 40, such that the upper surface 40*a* of the interlayer 40 may be modified to ensure hydrophilicity.

In some example embodiments, a heat treatment may be performed on the interlayer 40 before the UV treatment or the plasma treatment. Irregularities or non-uniformities such as protrusions and/or pores that may occur at the upper surface 40*a* of the interlayer 40 may be removed by the heat treatment. Thus, the upper surface 40*a* of the interlayer 40 may have a uniform surface morphology. As a result, an LMT layer 50 and an organic transfer layer 60 (see FIG. 4) successively formed on the interlayer 40 may also have uniform surface morphologies. Therefore, an OLED device manufactured using the donor substrate comprising the LMT layer 50 and the organic transfer layer 60 may have uniform luminescence and enhanced electrical characteristics.

In some example embodiments, the heat treatment may be carried out under an atmosphere containing an inert gas such as a nitrogen gas ($N_2$) or argon (Ar) gas, or under a vacuum atmosphere to prevent atoms or impurities in an environmental air from being captured in the interlayer 40.

In example embodiments, the heat treatment may be executed at a process temperature of from about 60° C. to about 150° C. When the process temperature of the heat treatment is less than about 60° C., the irregularities or the non-uniformities may not be sufficiently cured. In case that the process temperature exceeds about 150° C., the interlayer 40 may be damaged or transformed by the heat treatment to decrease the surface uniformity thereof.

Referring to FIG. 4, the LMT layer 50 and the organic transfer layer 60 may be sequentially formed on the interlayer 40.

In example embodiments, the LMT layer 50 may be formed using a low molecular weight material containing an element in Group I or a compound of elements in Group I and Group VII such as lithium (Li), sodium (Na), cesium (Cs), potassium (K), lithium fluoride (LiF), potassium fluoride (KF), cesium fluoride (CsF), lithium iodide (LiI), potassium iodide (KI), etc. The LMT layer 50 may be obtained by a vacuum evaporation process or a sputtering process. As illustrated in FIG. 3, the dangling bonds 40*b* may be exposed on the treated upper surface 40*a* of the interlayer 40 so that the low molecular weight material and the dangling bonds 40*b* may form a relatively weak bond therebetween by dipole interaction or electrostatic attraction. The LMT layer 50 may have a relatively thin thickness. In example embodiments, the LMT layer 50 may have a thickness of from about 3 Å to about 100 Å.

The organic transfer layer 60 may be formed on the LMT layer 50. The organic transfer layer 60 may correspond to an EML of an OLED device. The organic transfer layer 60 may further include optional organic layers of the OLED device. For example, the organic transfer layer 60 may additionally include an HTL, an HIL, an EIL, an ETL, etc. The organic transfer layer 60 may be formed using suitable materials in accordance with the types of the organic layers included therein. The organic transfer layer 60 may be obtained by a vacuum evaporation process, a spin coating process, a thermal evaporation process, etc.

The materials for forming the EML, the HIL, the HTL, the EIL and the ETL may be substantially the same as those described with reference to FIG. 1. Thus, detailed explanations thereof are omitted herein.

According to example embodiments, the LMT layer 50 may be formed between the organic transfer layer 60 and the interlayer 40. The LMT layer 50 may form a relatively weak bond with a surface of the interlayer 40 by dipole interaction or electrostatic attraction. Thus, the LMT layer 50 may be easily separated or detached from the interlayer 40 by a relatively low energy or a source power while performing a transfer process, e.g., an LITI process, so that the LMT layer 50 may be transferred onto a device substrate together with the organic transfer layer 60. Therefore, thermal damage or outgassing of the organic transfer layer 60 generated by a thermal energy during the LITI process may be prevented.

Figure 5:
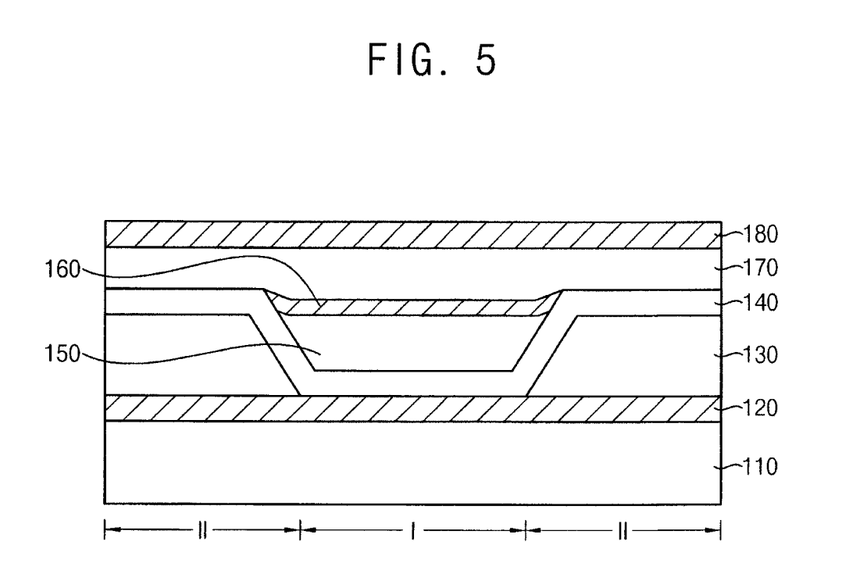
FIG. 5 is a cross-sectional view illustrating an organic light emitting display device in accordance with example embodiments.

FIG. 5 is a cross-sectional view illustrating an organic light emitting display device in accordance with example embodiments.

Referring to FIG. 5, the OLED device may include a lower substrate 110, a first electrode 120, a pixel defining layer (PDL) 130, an HTL 140, a low molecular weight layer 160, an EML 150, an ETL 170 and a second electrode 180.

The lower substrate 110 may include a transparent substrate such as a glass substrate, a quartz substrate, a transparent plastic substrate, etc. The lower substrate 110 may include a switching device (not illustrated) having a source electrode and a drain electrode, an insulation structure, etc. The switching device may have a thin film transistor (TFT) structure or an oxide semiconductor device.

The first electrode 120 may be disposed on the lower substrate 110. The first electrode 120 may include a transparent conductive material, for example, indium tin oxide (ITO), zinc tin oxide (ZTO), indium zinc oxide (IZO), zinc oxide (ZnOx), tin oxide (SnOx), etc. In example embodiments, the first electrode 120 may be electrically connected to the drain electrode of the switching device. The first electrode 120 may serve as an anode providing holes into the HTL 140.

The PDL 130 may be disposed on the first electrode 120 to partially expose a surface of the first electrode 120. Accordingly, a pixel region I and a non-pixel region II of the OLED device may be defined. The PDL 130 may include a photosensitive material such as acryl-based resin, polyimide, benzocyclobutene (BCB). Alternatively, the PDL 130 may include a non-photosensitive material or an inorganic material.

The HTL 140 may be disposed on the PDL 130 and the exposed first electrode 120. The HTL 140 may include, e.g., NPB, TPD, α-NPD, N-phenylcarbazole, polyvinylcarbazole, or a mixture of these materials.

In some example embodiments, an HIL may be additionally disposed beneath the HTL 140. The HIL may include, e.g., TCTA, m-MTDATA, m-MTDAPB, 2-TNATA or a mixture of these materials.

The EML 150 may be disposed on the HTL 140 in the pixel region I. The EML 150 may include at least one of light emitting materials for generating different colors of light, for example, a red color of light, a green color of light or a blue color of light. In some example embodiments, the EML 150 may include a mixture of the light emitting materials to generate a white color of light. The light emitting material may serve as a dopant of the EML 150. In this case, the EML 150 may further include a host material having a relatively large band gap.

The low molecular weight layer 160 may be disposed on the EML 150. The low molecular weight layer 160 may include a low molecular weight material containing an element in Group I or a compound of elements in Group I and Group VII such as lithium (Li), sodium (Na), cesium (Cs), potassium (K), lithium fluoride (LiF), potassium fluoride (KF), cesium fluoride (CsF), lithium iodide (LiI), potassium iodide (KI), etc. In example embodiments, the low molecular weight layer 160 may have a thickness of about 3 Å to about 100 Å.

The ETL 170 may be disposed on the low molecular weight layer 160 and on a portion of the ETL 140 in the non-pixel region II. The ETL 170 may include, e.g., Alq, PBD, TAZ, rubrene or a mixture of these materials.

The second electrode 180 may be disposed on the ETL 170. The second electrode 180 may include a transparent conductive material such as indium tin oxide (ITO), zinc tin oxide (ZTO), indium zinc oxide (IZO), zinc oxide (ZnOx), tin oxide (SnOx), etc. In example embodiments, the second electrode 180 may serve as a cathode providing electrons into the ETL 170.

In some example embodiments, an EIL may be further disposed between the ETL 170 and the second electrode 180. The EIL may include a low molecular weight material such as Alq3, a Ga complex or PBD, or polymer such as oxadiazole-based polymer.

A protection layer (not illustrated) and an upper substrate (not illustrated) may be disposed on the second electrode 180. Each of the protection layer and the upper substrate may include a transparent insulating material.

According to example embodiments, the low molecular weight layer 160 may be disposed between the EML 150 and the ETL 170. The low molecular weight layer 160 may include the element in Group I or the compound of elements in Group I and Group VII, and thus the low molecular weight layer 160 may have a lowest unoccupied molecular orbital (LUMO) energy substantially similar to that of the ETL or the EIL, and a band gap energy substantially lower than a highest occupied molecular orbital (HOMO) energy of the ETL or the EIL. Thus, the low molecular weight layer 160 may facilitate an electron transport and may block a hole transport. Therefore, electrical characteristics at an interface between the EML 150 and the ETL 170 may be improved.

Figure 6:
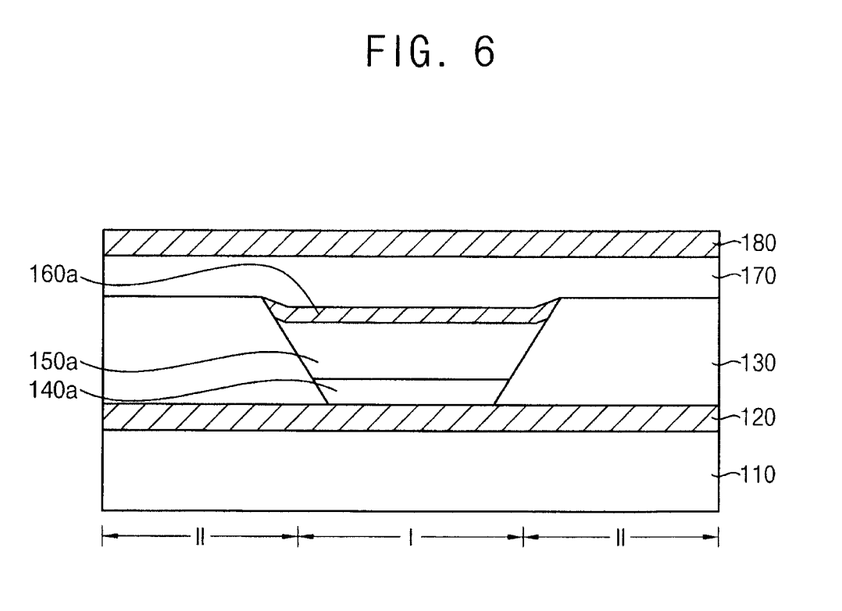
FIG. 6 is a cross-sectional view illustrating an organic light emitting display device in accordance with some example embodiments.

FIG. 6 is a cross-sectional view illustrating an organic light emitting display device in accordance with some example embodiments. The OLED device illustrated in FIG. 6 may have a construction substantially the same as or similar to that of the OLED device described with reference to FIG. 5 except for a shape of an HTL. Thus, like reference numerals refer to the like elements, and detailed descriptions thereof are omitted.

Referring to FIG. 6, an HTL 140a, an EML 150a and a low molecular weight layer 160a may be sequentially disposed on an exposed portion of a first electrode 120 and on a sidewall of a PDL 130. For example, the HTL 140a may be disposed selectively in a pixel region I.

Figure 7:
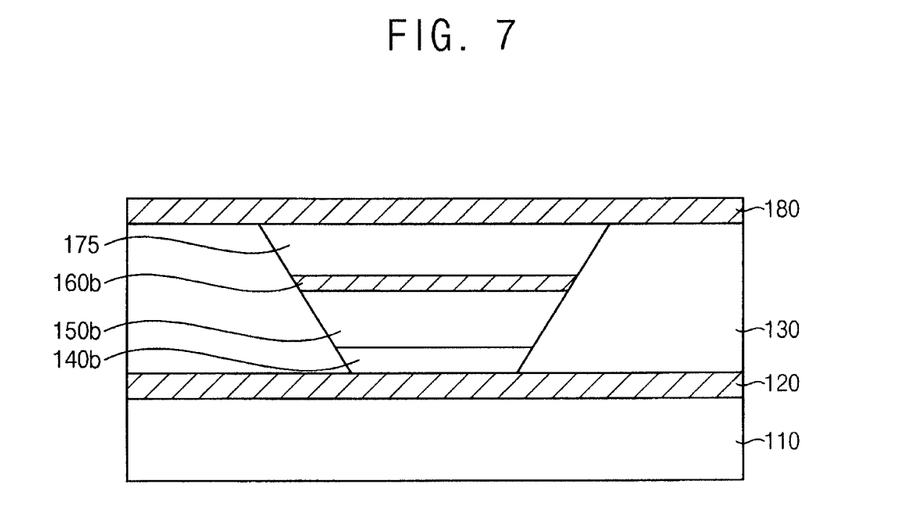
FIG. 7 is a cross-sectional view illustrating an organic light emitting display device in accordance with some example embodiments.

FIG. 7 is a cross-sectional view illustrating an organic light emitting display device in accordance with some example embodiments. The OLED device illustrated in FIG. 7 may have a construction substantially the same as or similar to that of the OLED device described with reference to FIG. 6 except for a shape of an ETL. Thus, like reference numerals refer to the like elements, and detailed descriptions thereof are omitted.

Referring to FIG. 7, an HTL 140b, an EML 150b, a low molecular weight layer 160b and an ETL 175 may sequentially disposed on an exposed portion of a first electrode 120 and on a sidewall of a PDL 130. For example, an organic light emitting structure comprising the HTL 140b, the EML 150b, the low molecular weight layer 160b and the ETL 175 may be confined by the PDL 130 disposed in a pixel region I. In this case, a second electrode 180 may be disposed on the PDL 130 and the ETL 175. The organic light emitting structure may further include an HIL (not illustrated) located between the first electrode 120 and the HTL 140b. The organic light emitting structure may also include an EIL (not illustrated) positioned between the ETL 175 and the second electrode 180.

FIGS. 8 to 11 are cross-sectional views illustrating a method of manufacturing an organic light emitting display device in accordance with example embodiments.

Figure 8:
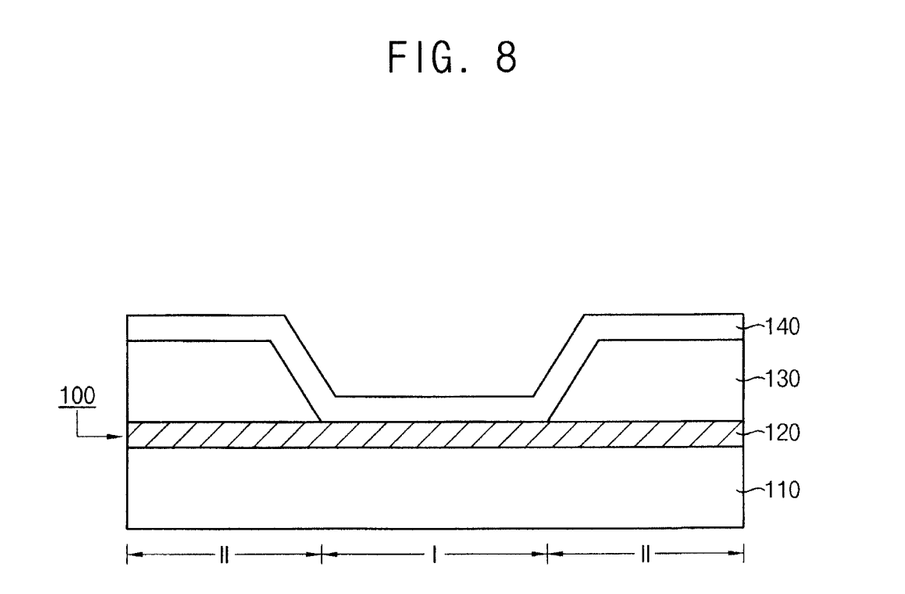
FIGS. 8 to 11 are cross-sectional views illustrating a method of manufacturing an organic light emitting display device in accordance with example embodiments.

Referring to FIG. 8, a device substrate 100 comprising a lower substrate 110, a first electrode 120 formed on the lower substrate 110 and a PDL 130 partially exposing the first electrode 120 may be prepared. An HTL 140 may be formed on the PDL 130 and the exposed first electrode 120.

The lower substrate 110 may be a transparent substrate such as a glass substrate, a quartz substrate, a transparent plastic substrate, etc. The lower substrate 110 may include a switching device (not illustrated) having a source electrode and a drain electrode, an insulation structure, etc. The switching device may have a TFT or an oxide semiconductor device.

The first electrode 120 may be formed using a transparent conductive material such as indium tin oxide, zinc tin oxide, indium zinc oxide, zinc oxide, tin oxide, etc. The first electrode 120 may be obtained by a sputtering process, an atomic layer deposition (ALD) process, a vacuum evaporation process, a printing process, etc. The first electrode 120 may be electrically connected to the drain electrode of the switching device.

A photosensitive material layer comprising, e.g., acryl-based resin, polyimide or benzocyclobutene may be formed on the first electrode 120. The photosensitive material layer may be partially removed by an exposure process and a developing process to form the PDL 130. In one example embodiment, a non-photosensitive organic layer or an inorganic material layer may be formed on the first electrode 120, and may be partially etched to form the PDL 130.

A pixel region I and a non-pixel region II of the OLED device may be defined by the PDL 130. In example embodiments, the first electrode 120 exposed by the PDL 130 may be positioned in the pixel region I, and the PDL 130 and a portion of the first electrode 120 may be positioned in the non-pixel region II.

The HTL 140 may be formed using a hole transport material such as NPB, TPD, α-NPD, N-phenylcarbazole or polyvinylcarbazole by a vacuum evaporation process, a thermal evaporation process, a slit coating process, a spin coating process, etc.

In some example embodiments, an HIL (not illustrated) may be formed on the PDL 130 and the exposed first electrode 12Q prior to forming the HTL 140. In this case, the HTL 140 may be formed on the HIL. The HIL may be formed using, e.g., TCTA, m-MTDATA, m-MTDAPB or 2-TNATA by a vacuum evaporation process, a thermal evaporation process, a slit coating process, a spin coating process, etc.

Figure 9:
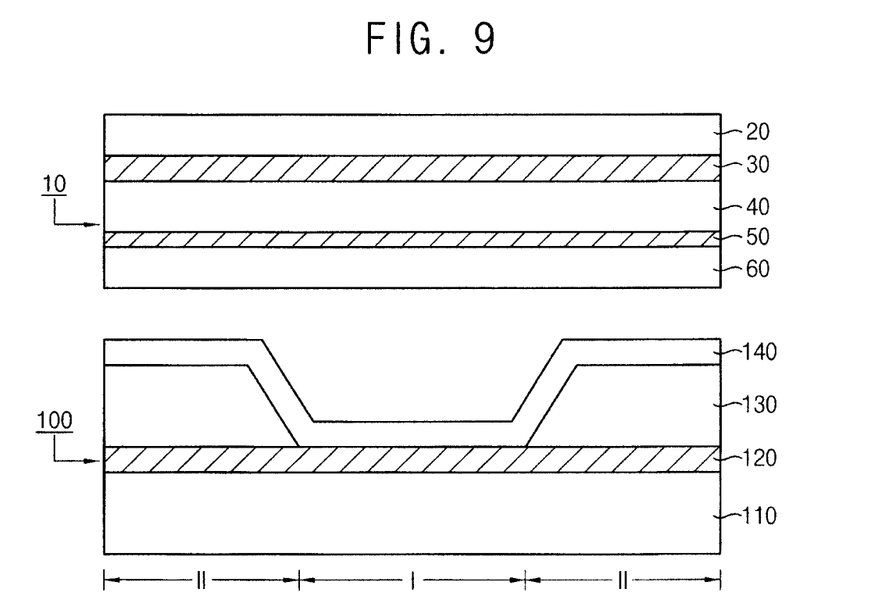

Referring to FIG. 9, a donor substrate 10 obtained by processes substantially the same as or similar to those described with reference to FIGS. 2 to 4 may be arranged or laminated on the device substrate 100, so that an organic transfer layer 60 may substantially face the first electrode 120 of the device substrate 100. In example embodiments, the organic transfer layer 60 may include an EML of the OLED device.

Figure 10:
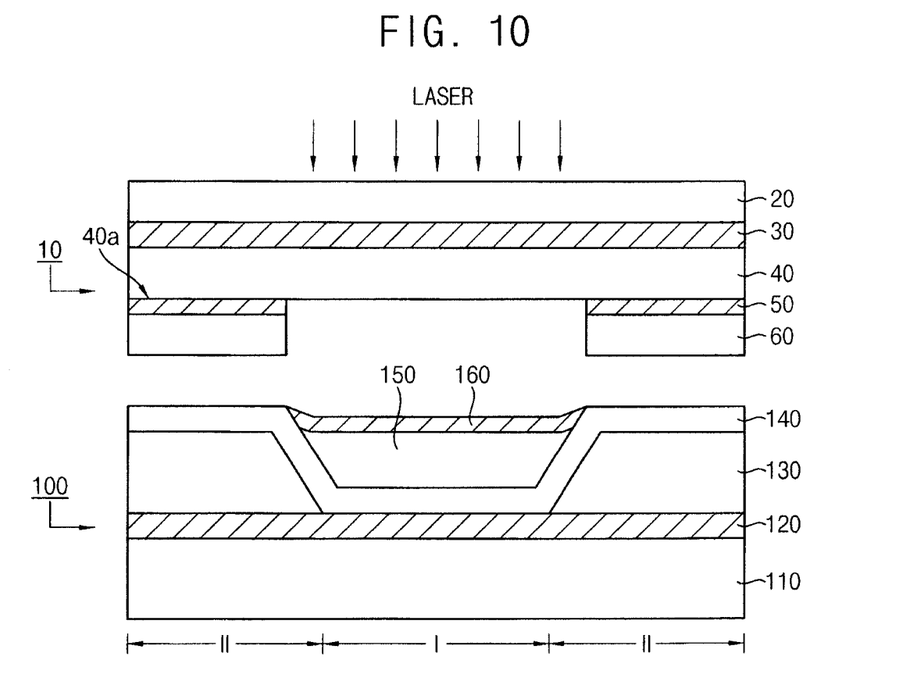

Referring to FIG. 10, portions of an LMT layer 50 and the organic transfer layer 60 may be transferred onto the device substrate 100 by, e.g., an LITI process. For example, a laser beam may be irradiated as indicated by arrows into the donor substrate 10 so that the portions of the LMT layer 50 and the organic transfer layer 60 substantially overlapping the pixel region I of the device substrate 100 may be transferred onto the HTL 140. Accordingly, an EML 150 and a low molecular weight layer 160 may be sequentially formed on a portion of the HTL 140 in the pixel region I.

The laser beam may be irradiated selectively into a region of the donor substrate 10 which substantially overlaps the pixel region I of the device substrate 100. In example embodiments, the laser beam may be irradiated using a mask (not illustrated) comprising a transparent region and a blocking region that may overlap the pixel region I and the non-pixel region II, respectively.

The laser beam may be converted into a thermal energy by an LTHC layer 30 and the thermal energy may be transferred into an interlayer 40. As described above, the LMT layer 50 may be combined with the interlayer 40 having a treated upper surface 40a by weak dipole interaction or electrostatic attraction. Thus, the LMT layer 50 may be easily detached or separated from the interlayer 40 by relatively weak energy or small laser source power, thereby being transferred onto the device substrate 100 together with the organic transfer layer 60. Therefore, thermal damage or outgassing phenomenon of the organic transfer layer 60 may be avoided while performing the LITI process.

Figure 11:
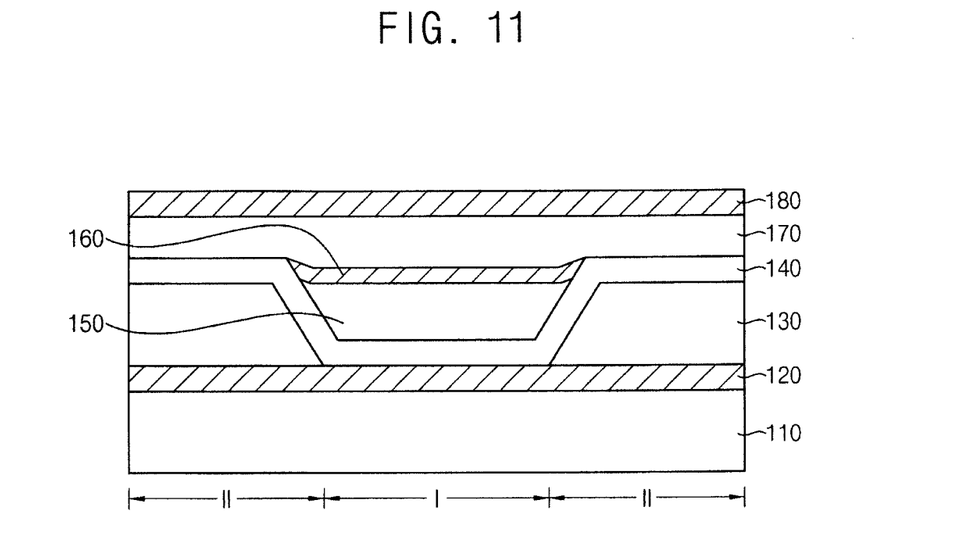

Referring to FIG. 11, an ETL 170 may be formed on the HTL 140 and the low molecular weight layer 160, and then a second electrode 180 may be formed on the ETL 170. The ETL 170 may be formed using, e.g., Alq, PBD, TAZ or rubrene by a vacuum evaporation process, a thermal evaporation process, a slit coating process, a spin coating process, etc. The second electrode 180 may be formed using a transparent conductive material such as indium zinc oxide, indium tin oxide, zinc oxide or tin oxide by a sputtering process, an ALD process, a vacuum evaporation process, a printing process, etc.

In an example embodiment, an EIL (not illustrated) may be further formed on the ETL 170 before forming the second electrode 180. The EIL may be formed using a low molecular weight material such as Alq3, a Ga complex or PBD, or polymer such as oxadiazole-based polymer. Additionally, a protection layer (not illustrated) and an upper substrate (not illustrated) may be formed on the second electrode 180 to obtain the OLED device according to example embodiments.

Figure 12:
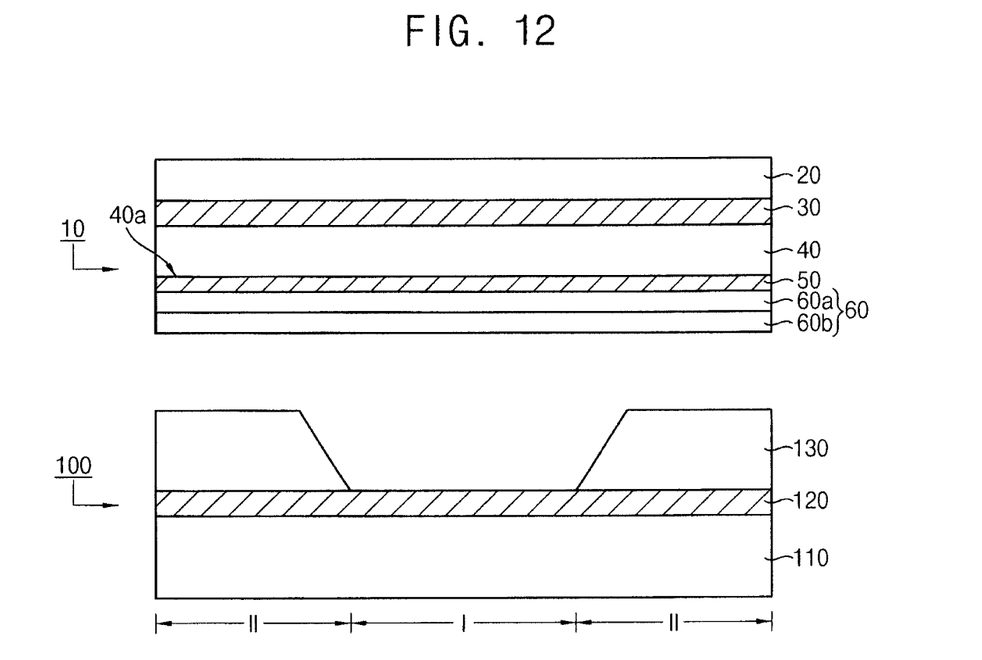
FIGS. 12 to 14 are cross-sectional views illustrating a method of manufacturing an organic light emitting display device in accordance with some example embodiments.
Figure 13:
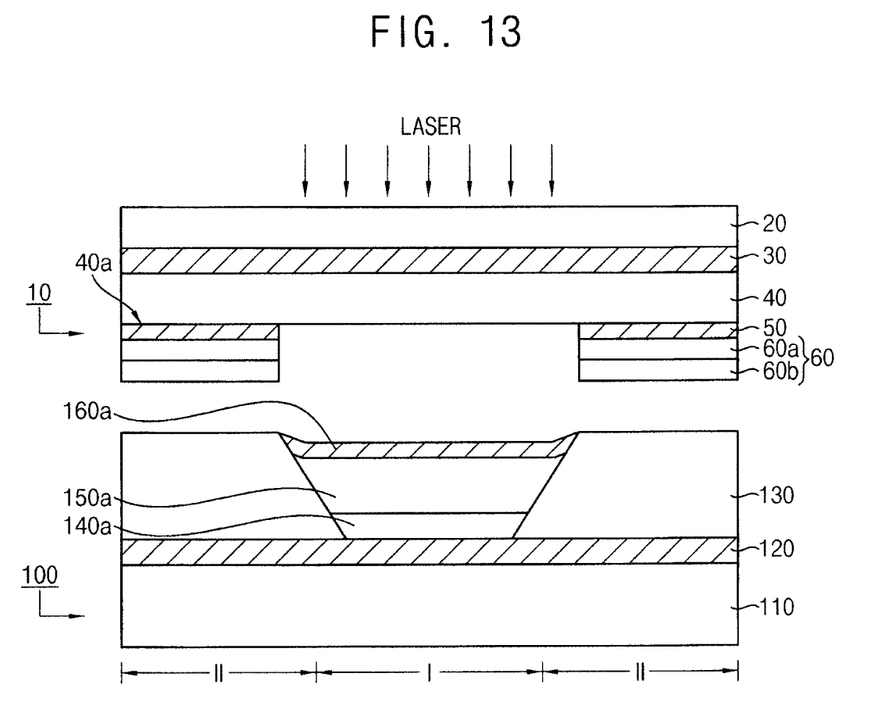
Figure 14:
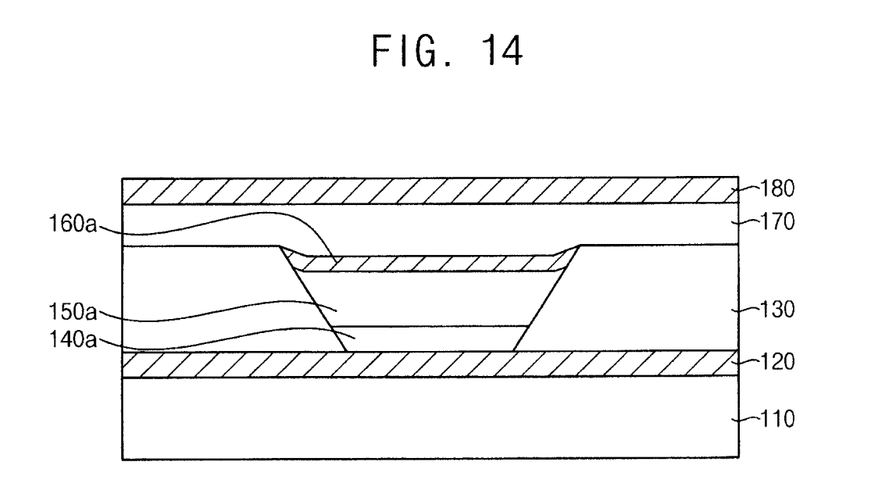

FIGS. 12 to 14 are cross-sectional views illustrating a method of manufacturing an organic light emitting display device in accordance with some example embodiments. Detailed descriptions on processes substantially the same as or similar to those described with reference to FIGS. 8 to 11 are omitted.

Referring to FIG. 12, a device substrate 100 comprising a lower substrate 110, a first electrode 120 formed on the lower substrate 110 and a PDL 130 partially exposing the first electrode 120 may be prepared. A donor substrate 10 obtained by processes substantially the same as or similar to those described with reference to FIGS. 2 to 4 may be arranged or laminated on the device substrate 100, so that an organic transfer layer 60 of the donor substrate 10 may substantially face the first electrode of the device substrate 100. In example embodiments, the organic transfer layer 60 may include materials of an EML and an HTL of the OLED device. For example, the organic transfer layer 60 may include a preliminary EML 60a and a preliminary HTL 60b sequentially stacked on an LMT layer 50.

Referring to FIG. 13, a laser beam may be irradiated as indicated by arrows into the donor substrate 10 so that portions of the LMT layer 50 and the organic transfer layer 60 which substantially overlap a pixel region I of the device substrate 100 may be transferred onto the exposed first electrode 120 in the pixel region I and a sidewall of the PDL 130. Accordingly, an HTL 140a, an EML 150a and a low molecular weight layer 160a may be sequentially formed on the exposed electrode 120 in the pixel region I.

Referring to FIG. 14, processes substantially the same as or similar to those illustrated with reference to FIG. 11 may be performed. Accordingly, an ETL 170 may be formed on the PDL 130 and the low molecular weight layer 160a, and then a second electrode 180 may be formed on the ETL 170. In one example embodiment, an EIL (not illustrated) may be further formed between the ETL 170 and the second electrode 180. Additionally, a protection layer (not illustrated) and an upper substrate (not illustrated) may be formed on the second electrode 180 to obtain the OLED device according to example embodiments.

Figure 15:
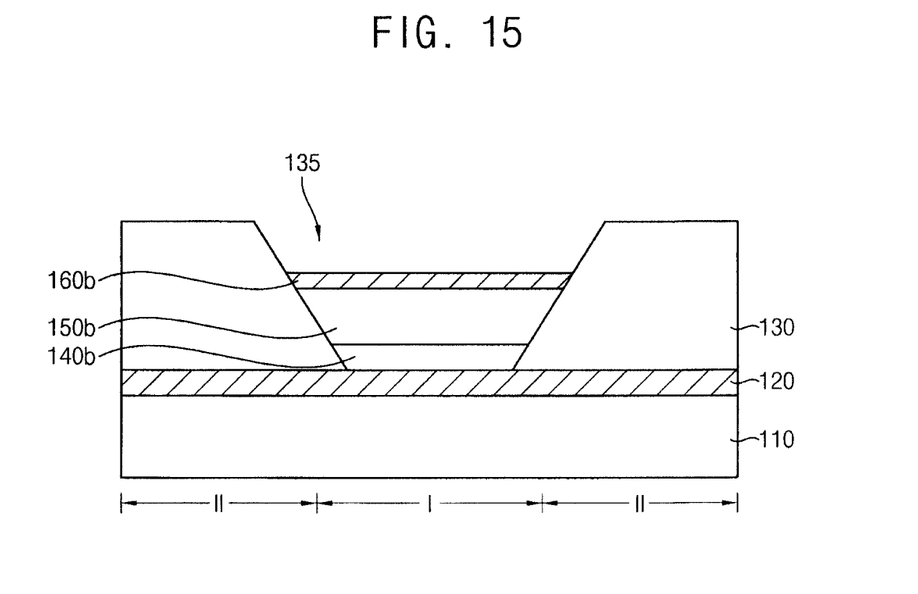
FIGS. 15 and 16 are cross-sectional views illustrating a method of manufacturing an organic light emitting display device in accordance with some example embodiments.
Figure 16:
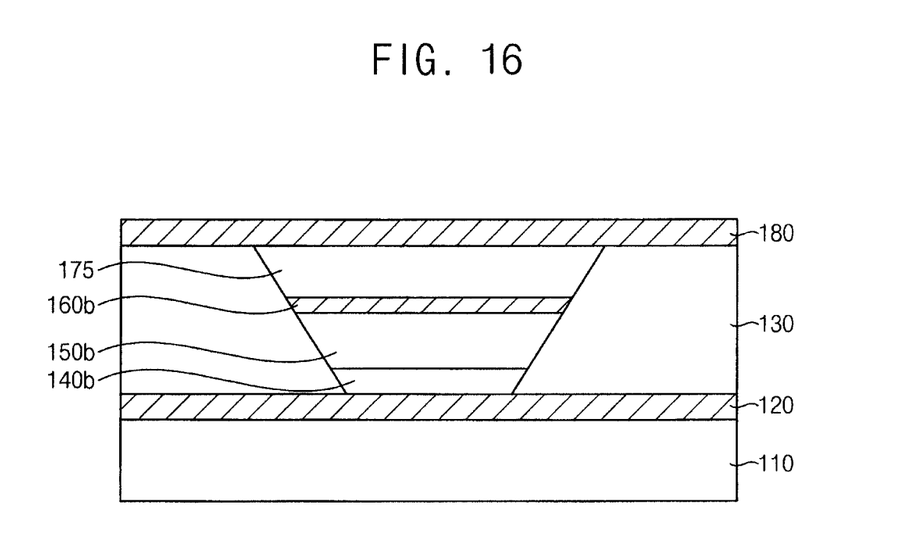

FIGS. 15 and 16 are cross-sectional views illustrating a method of manufacturing an organic light emitting display device in accordance with some example embodiments.

Referring to FIG. 15, processes substantially the same as or similar to those described with reference to FIGS. 12 and 13 may be performed. Accordingly, an HTL 140b, an EML 150b and a low molecular weight layer 160b may be sequentially formed on an exposed first electrode 120 in a pixel region I and on a sidewall of a PDL 130. In this case, the HTL 140b, the EML 150b and the low molecular weight layer 160b may partially fill a recess 135 that may be defined by the sidewall of the PDL 130 and a surface of the exposed first electrode 120.

Referring to FIG. 16, an ETL 175 filling a remaining portion of the recess 135 may be formed on the low molecular weight layer 160b and the sidewall of the PDL 130. Accordingly, an organic light emitting structure comprising the HTL 140b, the EML 150b, the low molecular weight layer 160b and the ETL 175, which is confined by the exposed first electrode 120 and the sidewall of the PDL 130, may be formed.

The ETL 175 may be formed using, e.g., Alq, PBD, TAZ or rubrene by an LITI process, a nozzle printing process, an inkjet printing process, an imprinting process, etc.

A second electrode 180 may be formed on a surface of the PDL 130 and the ETL 175. Additionally, a protection layer (not illustrated) and an upper substrate (not illustrated) may be formed on the second electrode 180 to obtain the OLED device according to example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present embodiments. Accordingly, all such modifications are intended to be included within the scope of the present embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a donor substrate, comprising:
   forming a light to heat conversion layer on a base layer;
   forming an interlayer on the light to heat conversion layer;
   performing an ultraviolet surface treatment on the interlayer to form a treated upper surface of the interlayer;
   forming a low molecular weight transfer layer using a low molecular weight material on the treated upper surface of the interlayer, the low molecular weight material comprising at least one selected from the group consisting of lithium (Li), sodium (Na), cesium (Cs), potassium (K), potassium fluoride (KF), lithium iodide (LiI) and potassium iodide (KI); and
   forming an organic transfer layer on the low molecular weight transfer layer,
   wherein the low molecular weight transfer layer facilitates electron transport and blocks hole transport.

2. The method of claim 1, wherein the low molecular weight transfer layer includes at least one selected from the group consisting of potassium fluoride (KF), lithium iodide (LiI) and potassium iodide (KI).

3. The method of claim 2, wherein the low molecular weight transfer layer is formed by a vacuum evaporation process or a sputtering process.

4. The method of claim 1, wherein the treated upper surface of the interlayer has hydrophilicity, and the treated upper surface has dangling bonds.

5. The method of claim 4, wherein the low molecular weight material is combined with the dangling bonds by a dipole interaction or an electrostatic attraction.

6. The method of claim 1, further comprising performing a heat treatment and/or a plasma treatment on the interlayer prior to the ultraviolet surface treatment.

7. The method of claim 6, wherein the heat treatment is performed at a temperature of from about 60° C. to about 150° C.

* * * * *